(12) United States Patent
Aggrawal et al.

(10) Patent No.: US 10,037,814 B2
(45) Date of Patent: Jul. 31, 2018

(54) TRACK AND HOLD WITH ACTIVE CHARGE CANCELLATION

(71) Applicant: TEXAS INSTRUMENTS INCORPORATED, Dallas, TX (US)

(72) Inventors: Himanshu Aggrawal, Houston, TX (US); Manar Ibrahim El-Chammas, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/261,303

(22) Filed: Sep. 9, 2016

(65) Prior Publication Data

US 2017/0076823 A1  Mar. 16, 2017

Related U.S. Application Data

(60) Provisional application No. 62/217,603, filed on Sep. 11, 2015.

(51) Int. Cl.
*G11C 27/02* (2006.01)

(52) U.S. Cl.
CPC .................................. *G11C 27/024* (2013.01)

(58) Field of Classification Search
CPC ..... G11C 27/02; G11C 27/024; G11C 27/026; G11C 27/028; H03K 5/1252
See application file for complete search history.

(56) References Cited

U.S. PATENT DOCUMENTS

| | | | | | |
|---|---|---|---|---|---|
| 4,962,325 A | * | 10/1990 | Miller | ...................... | H03F 1/303 327/65 |
| 5,570,048 A | * | 10/1996 | Rijns | .................... | H03K 17/162 327/337 |
| 5,572,154 A | * | 11/1996 | Rakers | ................... | H03K 17/74 327/494 |
| 6,052,000 A | * | 4/2000 | Nagaraj | ............... | G11C 27/024 327/91 |
| 6,636,083 B1 | * | 10/2003 | Wong | ................... | G11C 27/026 327/307 |

(Continued)

FOREIGN PATENT DOCUMENTS

| WO | WO 2009/034084 A1 | 3/2009 |
|---|---|---|
| WO | WO 2013/093018 A1 | 6/2013 |

OTHER PUBLICATIONS

International Search Report and Written Opinion of the International Searching Authority, PCT/US 2016/051331, dated Dec. 8, 2016 (8 pages).

*Primary Examiner* — Thomas J Hiltunen
(74) *Attorney, Agent, or Firm* — Andrew Viger; Charles A. Brill; Frank D. Cimino

(57) ABSTRACT

A track and hold circuit includes a primary sampling capacitor, a primary switching transistor, and a cancellation transistor. The primary switching transistor is configured to provide a track state that connects an input signal to the primary sampling capacitor and a hold state that isolates the input signal from the primary sampling capacitor. The cancellation transistor is coupled to the primary sampling capacitor. The cancellation transistor is configured to inject a charge onto the primary sampling capacitor that cancels a charge injected onto the primary sampling capacitor by the primary switching transistor while the primary switching transistor is in the hold state.

19 Claims, 4 Drawing Sheets

(56) References Cited

U.S. PATENT DOCUMENTS

| | | | | |
|---|---|---|---|---|
| 6,956,411 B1* | 10/2005 | Holloway | ............... | G11C 27/02 |
| | | | | 327/384 |
| 7,663,424 B2* | 2/2010 | Stulik | .................. | G11C 27/024 |
| | | | | 327/337 |
| 8,115,518 B1* | 2/2012 | Ali | ......................... | G11C 27/02 |
| | | | | 327/390 |
| 8,283,948 B2* | 10/2012 | Shrivastava | ......... | G11C 27/024 |
| | | | | 327/95 |
| 8,378,717 B1* | 2/2013 | Tsai | ..................... | G11C 27/026 |
| | | | | 327/95 |
| 9,246,505 B2* | 1/2016 | Aggrawal | ............... | H03M 1/12 |
| 9,576,679 B2* | 2/2017 | Powell | ................. | G11C 27/026 |
| 2009/0102517 A1 | 4/2009 | Setterberg | | |
| 2012/0092042 A1* | 4/2012 | Takei | .................. | G11C 27/024 |
| | | | | 327/94 |
| 2014/0070976 A1* | 3/2014 | Hurrell | .................. | G11C 27/02 |
| | | | | 341/172 |
| 2015/0229319 A1 | 8/2015 | Aggrawal et al. | | |

\* cited by examiner

| THIRD HARMONIC MEASUREMENTS (FUNDAMENTAL AT ~ -9dB) | TRACK (dB) | | HOLD (dB) | | SFDR (dB) | |
| --- | --- | --- | --- | --- | --- | --- |
| | 175 MHz | 2.5 GHz | 175 MHz | 2.5 GHz | 175 MHz | 2.5 GHz |
| WITHOUT ACTIVE CANCELLATION (ONE-TENTH SIZE) | ~144 | ~39 | ~100 | ~39 | ~90 | ~30 |
| WITHOUT ACTIVE CANCELLATION (FULL SIZE) | ~139 | ~93 | ~80 | ~80 | ~70 | ~70 |
| WITH ACTIVE CANCELLATION (FULL SIZE) | ~128 | ~98 | ~114 | ~102 | ~105 | ~93 |
| IMPROVEMENT | | | ~34 | ~22 | ~35 | ~23 |

FIG. 5

TRACK AND HOLD WITH ACTIVE CHARGE CANCELLATION

CROSS-REFERENCE TO RELATED APPLICATIONS

The present application claims priority to U.S. Provisional Patent Application No. 62/217,603, filed Sep. 11, 2015, titled "Active Charge Cancellation Technique to Increase the Linearity of High-Speed ADCs," which is hereby incorporated herein by reference in its entirety.

BACKGROUND

Electronic circuitry often includes devices for transforming analog signals into digital signals and vice versa. For example, a digital-to-analog converter (DAC) may be used to transform digital signals into analog signals. Conversely, an analog-to-digital converter (ADC) may be used to transform analog signals into digital signals.

One type of circuit that is often used when converting analog signals to digital signals is a track and hold circuit. A track and hold circuit generally switches between two modes, a track mode and a hold mode. While in track mode, an input signal is fed to a storage device. When the circuit switches to hold mode, the storage device holds the value of the input signal at the time the switch occurred. The track and hold circuit outputs the held value, e.g., to an ADC, for the duration of the time that the circuit is in hold mode

SUMMARY

A track and hold with active cancellation circuitry that injects a charge that cancels a non-linear charge injected by a sampling switch is disclosed herein. In one embodiment, a track and hold circuit includes a primary sampling capacitor, a primary switching transistor, and a cancellation transistor. The primary switching transistor is configured to provide a track state that connects an input signal to the primary sampling capacitor and a hold state that isolates the input signal from the primary sampling capacitor. The cancellation transistor is coupled to the primary sampling capacitor. The cancellation transistor is configured to inject a charge onto the primary sampling capacitor that cancels a charge injected onto the primary sampling capacitor by the primary switching transistor while the primary switching transistor is in the hold state.

In another embodiment, a charge cancellation circuit includes a cancellation transistor and a switch. The charge cancellation transistor is coupled to a first sampling capacitor. The charge cancellation transistor is configured to inject a charge onto the first sampling capacitor that cancels a charge injected onto the first sampling capacitor by a first switching transistor while the first switching transistor is in a high impedance state. The switch is coupled to a body terminal of the charge cancellation transistor, and is configured to connect the body terminal of the charge cancellation transistor to a reference voltage while the first switching transistor is in the high impedance state, and connect the body terminal of the charge cancellation transistor to a common voltage while the first switching transistor is in a low impedance state.

In a further embodiment, a track and hold circuit includes a first sampling capacitor, a first switching transistor, a cancellation transistor, a first switch, and a second switch. The first switching transistor is configured to connect a signal source to the first sampling capacitor while in a first state, and to isolate the signal source from the first sampling capacitor while in a second state. The cancellation transistor is coupled to the first sampling capacitor. The cancellation transistor is configured to inject a charge onto the first sampling capacitor that cancels a charge injected onto the first sampling capacitor by the first switching transistor while the first switching transistor is in the second state. The first switch is coupled to a body terminal of the first switching transistor. The first switch is configured to connect the body terminal of the first switching transistor to a source terminal of the first switching transistor while the first switching transistor is in the first state, and to connect the body terminal of the first switching transistor to a common voltage while the first switching transistor is in the second state. The second switch is coupled to a body terminal of the cancellation transistor. The second switch is configured to connect the body terminal of the cancellation transistor to a reference voltage while the first switching transistor is in the second state, and to connect the body terminal of the cancellation transistor to a common voltage while the first switching transistor is in the first state.

BRIEF DESCRIPTION OF THE DRAWINGS

For a detailed description of various examples, reference will now be made to the accompanying drawings in which:

FIG. 5 shows performance of track and hold circuits with and without active cancellation.

DETAILED DESCRIPTION

Figure 1:
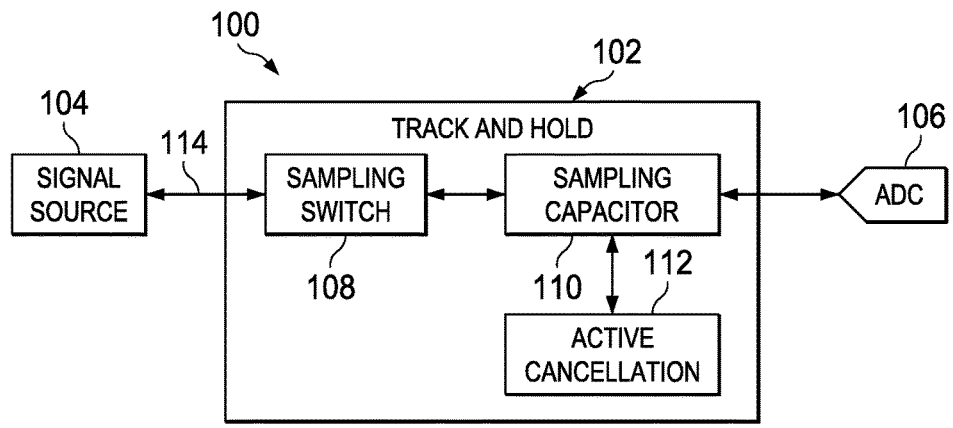
FIG. 1 shows a block diagram for a system that includes a track and hold with active cancellation in accordance with various embodiments.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be based on Y and any number of other factors.

A track and hold circuit includes a sampling switch, generally including a field effect transistor (FET), that switches an input signal to a sampling capacitor. The linearity of a high-speed analog-to-digital converter (ADC) coupled to a track and hold circuit (e.g., a top plate sampled track and hold circuit) may be predominantly limited by the non-linear charge injected by the sampling switch of the track and hold. The injected non-linear charge may be reduced by reducing the size of the sampling switch. However, reducing the size of the sampling switch may reduce the bandwidth of the ADC. Embodiments of the present disclosure apply active cancellation to mitigate the effect of non-linear charge injected by the sampling switch of the track and hold circuit.

For high-frequency ADCs, the size of the sampling switch may be set by the RC constant of the sampling switch resistance and sampling capacitor. Thus, for high-frequency operation, the sampling switch may be relatively large to reduce the "ON" resistance, and increase the bandwidth.

In track mode, the sampling switch may be linearized by bootstrapping both the gate (to keep gate-to-source voltage ($V_{GS}$) constant) and the body (to keep $V_T$ constant). However, when the track-and-hold switches to hold mode, the body of the sampling switch may be switched to ground (to ensure a reverse-biased source-body connection and for reduced signal feed-through). Switching the FET body to ground may inject a non-linear signal dependent charge onto the sampling capacitor, which may degrade the linearity of the ADC. The dominant source of this injected charge may be the voltage dependent pn-junction capacitance between the sampling switch's drain and body ($C_{DB}$). When the body switches from the input signal to ground, the charge on the sampling capacitor may be shared with this junction capacitance. Increasing the switch size to improve performance at higher frequencies may degrade performance at lower frequencies because the junction capacitance may increase, and thus the nonlinear charge in the junction capacitance may also increase.

Embodiments of the present disclosure include a track and hold with active cancellation circuitry that injects a charge opposite to the non-linear charge injected by sampling switch. To cancel the injected charge, embodiments include a dummy switch that may be half the size of the sampling switch. The body of the dummy switch is toggled to an opposite state of that of the sampling switch. For example, when the body of the sampling switch goes from the input signal to ground (as it transitions from track to hold), the body of the dummy switch is switched from ground to the held-signal. This complementary architecture mitigates the effects of drain-body capacitance ($C_{DB}$) of the sampling switch.

FIG. 1 shows a block diagram for a system 100 that includes track and hold circuit 102 with active cancellation in accordance with various examples. The system 100 includes a signal source 104, a track and hold circuit 102, and an ADC 106. The signal source 104 may be any generator or propagator of analog signals. The ADC 106 may be a FLASH ADC, a successive approximation ADC, or any other type of ADC. The track and hold 102 receives an input signal 114 from the signal source 104.

The track and hold 102 includes a sampling switch 108, a sampling capacitor 110, and active cancellation circuitry 112. The sampling capacitor 110 is coupled to both the sampling switch 108 and the active cancellation circuitry 112. The sampling switch 108 switches the input signal 114 to the sampling capacitor 110. That is, while the track and hold 102 is in track mode, the sampling switch 108 routes the input signal 114 to the sampling capacitor to charge the sampling capacitor 110. While the track and hold 102 is in hold mode, the sampling switch 108 isolates the sampling capacitor 110 from the signal source 104 to allow the ADC 106 to process the voltage on the sampling capacitor 110. When the track and hold 102 switches from track mode to hold mode, the sampling switch 108 injects a non-linear charge onto the sampling capacitor 110. To compensate for the non-linear charge injected by the sampling switch 108, the active cancellation circuitry 112 injects a complementary charge onto the sampling capacitor 110. The complementary charge injected by the active cancellation circuitry 112 cancels the effect of the non-linear charge injected by the sampling switch 108.

Figure 2:
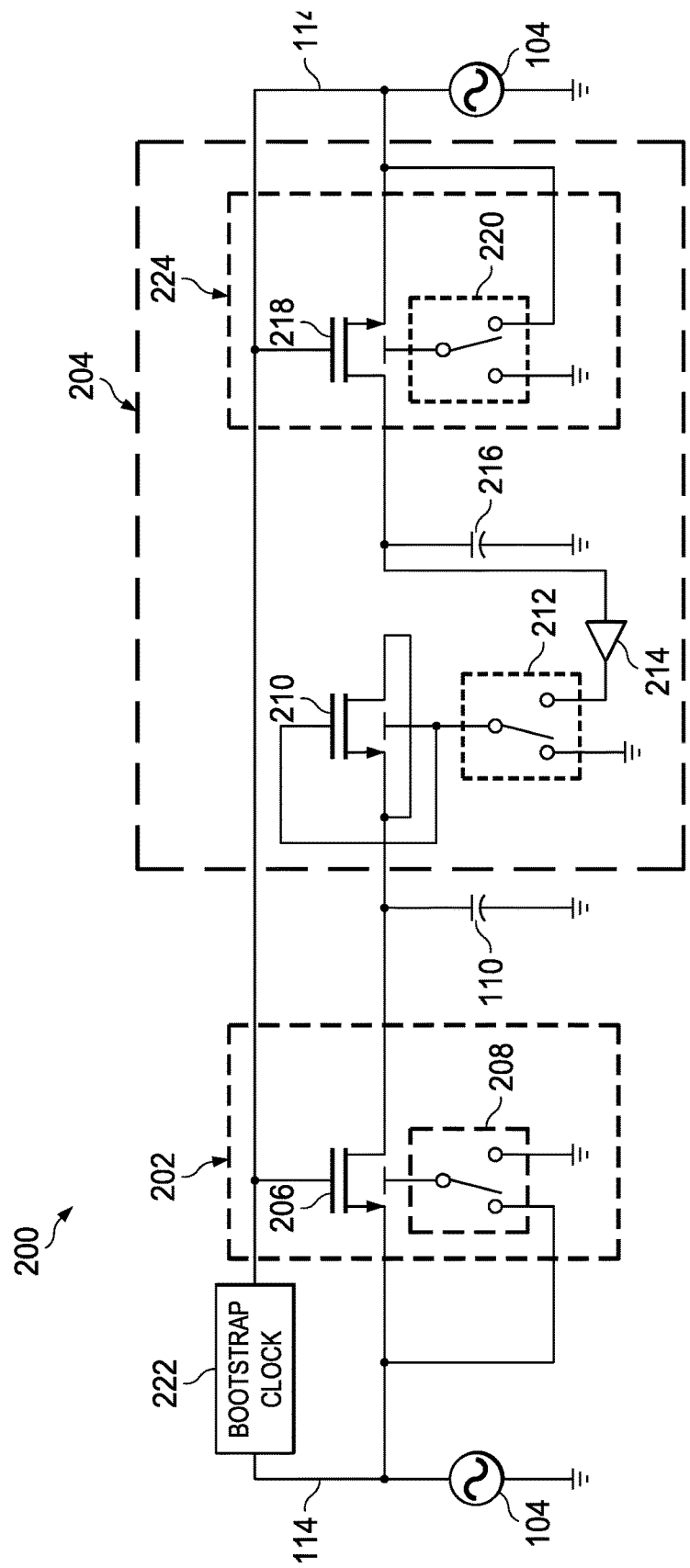
FIG. 2 shows a schematic diagram for a track and hold circuit that includes active cancellation in accordance with various embodiments.

FIG. 2 shows a schematic diagram for a track and hold circuit 200 that includes active cancellation in accordance with various examples. The track and hold circuit 200 is an embodiment of the track and hold circuit 102. The track and hold circuit 200 includes a sampling switch 202, a sampling capacitor 110, clock bootstrap circuitry 222, and active cancellation circuitry 204. The sampling switch 202 includes a FET 206 that, in track mode, is activated to connect the input signal 114 to the sampling capacitor 110, and, in hold mode, is deactivated to isolate the sampling capacitor 110 from the input signal 114.

The clock bootstrap circuitry 222 and the bootstrap switch 208 operate, in track mode, to improve the linearity of the FET 206 by bootstrapping the gate of the FET 206, based on the input signal 114, to keep gate-to-source voltage ($V_{GS}$) constant (i.e., keep switch resistance constant), and bootstrapping the body of the FET 206 to the input signal 114 to keep body-to-source voltage constant (i.e., keep channel charge constant). The bootstrap switch 208 connects the body of the FET 206 to the input signal 114 while the track and hold 200 is in track mode, and connects the body of the FET 206 to ground while the track and hold 200 is in hold mode. The bootstrap switch 208 may be implemented with any circuitry that can switchably connect the body of the FET 206 to ground and the input signal 114. Thus, the bootstrapped gate and body keep the resistance and channel charge of the FET 206 constant.

When the track and hold 200 is switched to hold mode, and the FET 206 deactivated, the body of the FET 206 is connected to ground (to ensure a reverse-biased source-body connection and for reduced signal feed-through). The positive drain to body voltage of the FET 206 creates a reverse biased junction having voltage dependent capacitance. The capacitance ($C_{DB}$) is a non-linear function of the voltage across the sampling capacitor 110 (i.e., drain to body voltage ($V_{DB}$) of FET 206, $C_{DB}$ is proportional to $\sqrt{V_{DB}}$), and the injected charge may be:

$$Q_{inj} = C_{DB} \times V_{DB} \propto V_{DB}^{3/2}. \qquad (1)$$

Thus, connecting the body of the FET 206 to ground may inject a non-linear signal dependent charge onto the sampling capacitor 110, which may, in turn, degrade the linearity of ADC 106.

The active cancellation circuitry 204 is coupled to the sampling switch 202 and the sampling capacitor 110. The active cancellation circuitry 204 is an embodiment of the active cancellation circuitry 112. The active cancellation circuitry 204 includes an auxiliary sampling switch 224, and auxiliary sampling capacitor 216, a dummy FET 210, and a bootstrap switch 212. The auxiliary sampling switch 224 includes FET 218 which, similar to the FET 206, switchably connects the input signal 114 to the auxiliary sampling capacitor 216 while the track and hold 200 is in the hold state, and isolates the auxiliary sampling capacitor 216 from the input signal 114 while the track and hold 200 is in the hold mode. The gate of the auxiliary switching FET 218 is driven by the bootstrap clock signal that drives the gate of the primary switching FET 206, and the body of the FET 218 is switched between the input signal and ground synchronously with the FET 206. That is, while the body of the FET 206 is connected to the input signal 114, the body of the FET 218 is connected to the input signal 114, and while the body of the FET 206 is connected to ground, the body of the FET 218 is connected to ground. Accordingly, the auxiliary sampling switch 224 and the auxiliary sampling capacitor 216 form a redundant track and hold circuit in which the voltage across the auxiliary sampling capacitor 216 is approximately equal to the voltage across the primary sampling capacitor 110.

The dummy FET 210 is coupled to the primary sampling capacitor 110 and to the auxiliary sampling capacitor 216. A unity gain buffer amplifier 214 couples the auxiliary sampling capacitor 216 to the bootstrap switch 212. Some embodiments may couple the auxiliary sampling capacitor 216 directly to the bootstrap switch 212 and omit the buffer amplifier 214. The bootstrap switch 212 is connected to the body and gate of the dummy FET 210. The bootstrap switch 212 connects the body of the dummy FET 210 to ground while the track and hold 200 is in track mode (keeping the drain-body junction reversed biased) and connects the body of the dummy FET 210 to the auxiliary sampling capacitor 216 while the track and hold 200 is in hold mode. That is, the body of the dummy FET 210 is connected to ground while the body of the FET 206 is connected to the input signal 114, and body of the dummy FET 210 is connected to the auxiliary sampling capacitor 216 while the body of the FET 206 is connected to ground. The source and drain of the dummy FET 210 are connected. Consequently, the dummy FET 210 may by smaller than the FET 206 (e.g., half the size of the FET 206). While the track and hold 200 is in hold mode, the charge injected onto the sampling capacitor 110 by the dummy FET 210 cancels the charge injected onto the sampling capacitor 110 by the FET 206. Cancellation of the nonlinear charge by the active cancellation circuitry 204 allows the track and hold 200 to provide over 90 dB of spurious-free dynamic range at frequencies exceeding 2.5 gigahertz (GHz).

Figure 3:
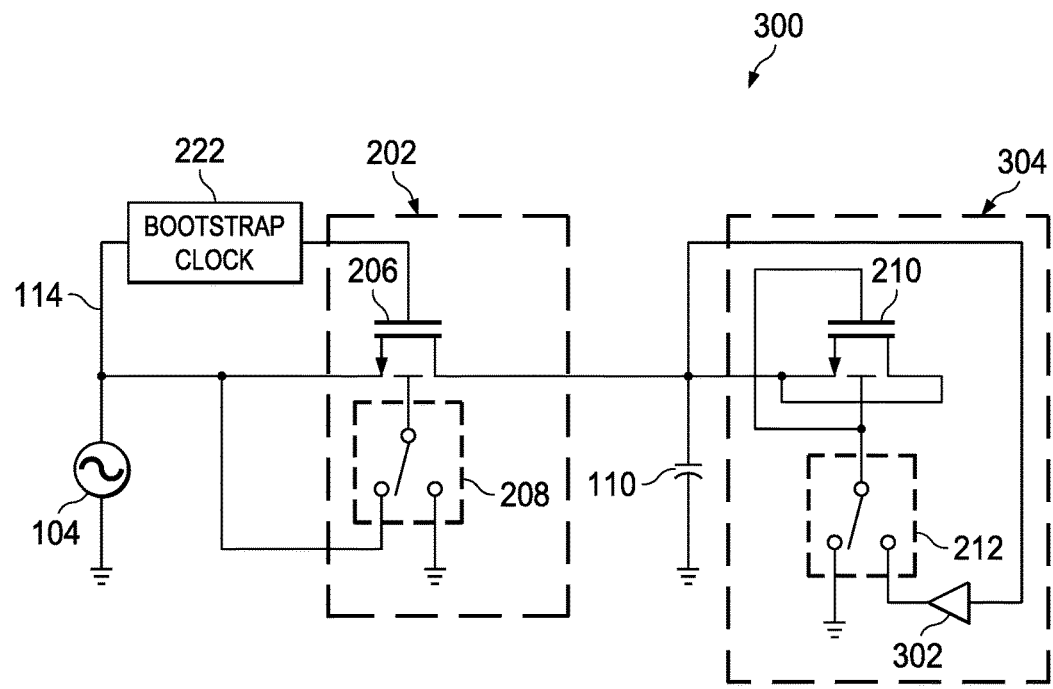
FIG. 3 shows a schematic diagram for a track and hold circuit that includes active cancellation in accordance with various embodiments.

FIG. 3 shows a schematic diagram for a track and hold circuit 300 that includes active cancellation in accordance with various examples. The track and hold circuit 300 is an embodiment of the track and hold circuit 102. The track and hold circuit 300 includes a sampling switch 202, a sampling capacitor 110, clock bootstrap circuitry 222, and active cancellation circuitry 304. The sampling switch 202 includes a FET 206 that, in track mode, is activated to connect the input signal 114 to the sampling capacitor 110, and, in hold mode, is deactivated to isolate the sampling capacitor 110 from the input signal 114.

The clock bootstrap circuitry 222 and the bootstrap switch 208 operate, in track mode, to improve the linearity of the FET 206 by bootstrapping the gate of the FET based on the input signal 114 to keep gate-to-source voltage ($V_{GS}$) constant (i.e., keep switch resistance constant), and bootstrapping the body of the FET 206 to the input signal 114 to keep body-to-source voltage constant (i.e., keep channel charge constant). The bootstrap switch 208 connects the body of the FET 206 to the input signal 114 while the track and hold 300 is in track mode, and connects the body of the FET 206 to ground while the track and hold 300 is in hold mode. The bootstrap switch 208 may be implemented with any circuitry that can switchably connect the body of the FET 206 to ground and the input signal 114. Thus, the bootstrapped gate and body keep the resistance and channel charge of the FET 206 constant.

When the track and hold 300 is switched to hold mode, and the FET 206 is deactivated, the body of the FET 206 is connected to ground (to ensure a reverse-biased source-body connection and for reduced signal feed-through). The positive drain to body voltage of the FET 206 creates a reverse biased junction having voltage dependent capacitance. The capacitance ($C_{DB}$) is a non-linear function of the voltage across the sampling capacitor 110 (i.e., drain to body voltage ($V_{DB}$) of FET 206, $C_{DB}$ is proportional to $\sqrt{V_{DB}}$), and the injected charge may be as described in equation (1) above. Thus, connecting the body of the FET 206 to ground may inject a non-linear signal dependent charge onto the sampling capacitor 110, which may, in turn, degrade the linearity of ADC 106.

The active cancellation circuitry 304 is coupled to the sampling switch 202 and the sampling capacitor 110. The active cancellation circuitry 304 is an embodiment of the active cancellation circuitry 112. The active cancellation circuitry 304 includes a dummy FET 210, a bootstrap switch 212, and a buffer amplifier 302. The dummy FET 210 is coupled to the sampling capacitor 110. The buffer amplifier 302 is a unity gain buffer amplifier that couples the sampling capacitor 110 to the bootstrap switch 212. The bootstrap switch 212 is connected to the body and gate of the dummy FET 210. The bootstrap switch 212 connects the body of the dummy FET 210 to ground while the track and hold 300 is in track mode (keeping the drain-body junction reversed biased) and connects the body of the dummy FET 210 to the sampling capacitor 110 while the track and hold 300 is in hold mode. That is, the body of the dummy FET 210 is connected to ground while the body of the FET 206 is connected to the input signal 114, and body of the dummy FET 210 is connected to the sampling capacitor 110 while the body of the FET 206 is connected to ground. The source and drain of the dummy FET 210 are connected. Consequently, the dummy FET 210 may by smaller than the FET 206 (e.g., half the size of the FET 206). While the track and hold 300 is in hold mode, the charge injected onto the sampling capacitor 110 by the dummy FET 210 cancels the charge injected onto the sampling capacitor 110 by the FET 206. Performance of the active cancellation circuitry 304 may be similar to that of the active cancellation circuitry 204.

Figure 4A:
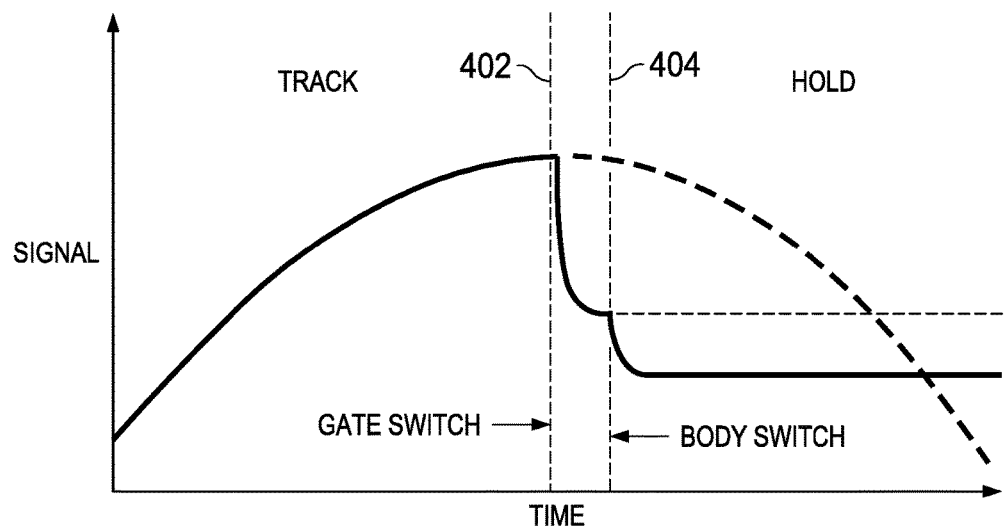
FIGS. 4A and 4B respectively show signals in a track and hold circuit without active cancellation and a track and hold circuit with active cancellation.
Figure 4B:
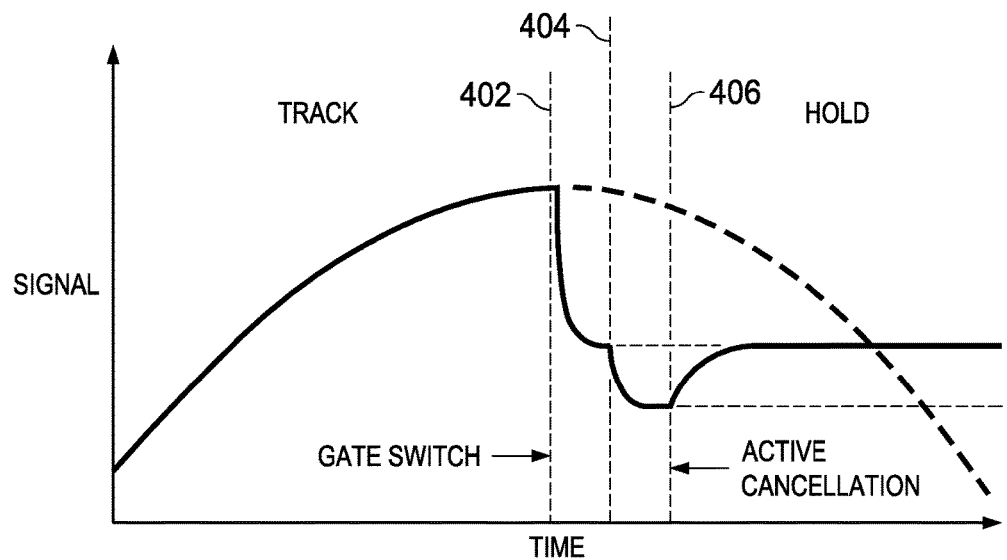

FIGS. 4A and 4B respectively show signals in a track and hold circuit without active cancellation and a track and hold circuit with active cancellation. FIG. 4A shows a track and hold circuit that lacks active cancellation circuitry 204, 304 tracking an input signal up to time 402. At time 402, a switching FET of the track and hold is deactivated to open the sampling switch and voltage on a sampling capacitor droops as constant channel charge is dumped on the sampling capacitor 110. Hold linearity is unaffected. At time 404, a bootstrap switch connects the body the switching FET to ground and the switching FET injects a non-linear signal dependent charge onto the sampling capacitor. The non-linear signal dependent charge injected onto the sampling capacitor may degrade the linearity of an ADC coupled to the track and hold circuit.

FIG. 4B shows the track and hold circuit 102 tracking the input signal 114 up to time 402. At time 402, the sampling switch 108 is opened by negating the control signal applied to the gate of the FET 206 and voltage on the sampling capacitor 110 droops as constant channel charge is dumped on the sampling capacitor 110. Hold linearity is unaffected. At time 404, bootstrap switch 208 connects the body of the FET 206 to ground and the FET 206 injects a non-linear charge signal dependent charge onto the sampling capacitor 110. At time 406, the active cancellation circuitry 204, 304 cancels the charge injected onto the sampling capacitor 110 by the FET 206, and linearity of the ADC 106 is unaffected.

FIG. 5 shows performance of track and hold circuits with and without active cancellation circuitry 204, 304. FIG. 5 shows that relative to a track and hold without active cancellation circuitry 112 a track and hold circuitry with the active cancellation circuitry 112 can provide 34 dB reduction of third harmonics at 175 megahertz (MHz) and 22 dB reduction of third harmonics at 2.5 gigahertz (GHz). Similarly, FIG. 5 shows that a track and hold with the active cancellation circuitry 112 can provide an increase in spurious free dynamic range of about 35 dB at 175 MHz, and about 23 dB at 2.5 GHz relative to a track and hold without active cancellation circuitry 112.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A circuit for track-and-hold sampling of an analog input signal, comprising:
    a primary sampling capacitor;
    a primary switching field effect transistor (primary switching transistor) controllable to provide:
        a track state that connects the input signal to the primary sampling capacitor; and
        a hold state that isolates the input signal from the primary sampling capacitor;
    the primary sampling capacitor to provide a hold signal during the hold state; and
    a cancellation field effect transistor (cancellation transistor) coupled to the primary sampling capacitor, wherein the cancellation transistor is controllable to inject a charge onto the primary sampling capacitor that cancels a charge injected onto the primary sampling capacitor by the primary switching transistor when the primary switching transistor switches from the track state to the hold state; and
    a first switch coupled to a body terminal of the primary switching transistor, and controllable to connect the body terminal of the primary switching transistor to a source terminal of the primary switching transistor when the primary switching transistor is in the track state, and connect the body terminal of the primary switching transistor to a common voltage when the primary switching transistor is in the hold state;
    a second switch coupled to the body terminal of the cancellation transistor, and controllable to connect the body terminal of the cancellation transistor to a held signal terminal coupled to receive a held signal voltage corresponding to the hold signal on the primary sampling capacitor when the primary switching transistor is in the hold state, and connect the body terminal of the cancellation transistor to the common voltage when the primary switching transistor is in the track state.

2. The circuit of claim 1, wherein the body terminal of the cancellation transistor is connected to a gate terminal of the cancellation transistor.

3. The circuit of claim 1, wherein the held signal terminal of the cancellation transistor is coupled to the primary sampling capacitor.

4. The circuit of claim 1, further comprising an auxiliary hold circuit to provide the held signal voltage, comprising:
    an auxiliary sampling capacitor; and
    an auxiliary switching field effect transistor (auxiliary switching transistor) controllable to:
        connect the input signal to the auxiliary sampling capacitor during the track state; and
        isolate the input signal from the auxiliary sampling capacitor during the hold state;
    wherein the auxiliary sampling capacitor is switchably connected to the held signal terminal of the cancellation transistor during the hold state.

5. The circuit of claim 4, further comprising a buffer amplifier comprising:
    an input terminal connected to the auxiliary sampling capacitor; and
    an output terminal connected to the held signal terminal of the cancellation transistor.

6. The circuit of claim 3, further comprising a buffer amplifier comprising:
    an input terminal connected to the primary sampling capacitor; and
    an output terminal connected to the held signal terminal of the cancellation transistor.

7. The circuit of claim 1, where a source terminal of the cancellation transistor is connected to a drain terminal of the cancellation transistor.

8. The circuit of claim 1, wherein the cancellation transistor is approximately half as large as the primary switching transistor.

9. A circuit for analog-to-digital conversion, comprising:
    an input terminal coupleable to receive an input analog signal (input signal);
    a first sampling capacitor;
    a first switching field effect transistor (first switching transistor) controllable to provide:
        a track state that connects the input signal to the first sampling capacitor; and
        a hold state that isolates the input signal from the first sampling capacitor;
    the first sampling capacitor to provide a hold sample during the hold state; and
    a charge cancellation field effect transistor (charge cancellation transistor) coupled to the first sampling capacitor, wherein the charge cancellation transistor is controllable to inject a charge onto the first sampling capacitor that cancels a charge injected onto the first sampling capacitor by the first switching transistor when the first switching transistor switches from the track state to the hold state; and
    a first switch coupled to a body terminal of the first switching transistor, and controllable to connect the body terminal of the first switching transistor to a source terminal of the first switching transistor when the first switching transistor is in the track state, and connect the body terminal of the first switching transistor to a common voltage when the primary switching transistor is in the hold state; and
    a second switch coupled to a body terminal of the charge cancellation transistor, and controllable to connect the body terminal of the charge cancellation transistor to a held signal terminal coupled to receive a held signal voltage corresponding to the hold signal on the first sampling capacitor when the first switching transistor is in the hold state, and connect the body terminal of the charge cancellation transistor to a common voltage while the first switching transistor is in the track state; and analog-to-digital conversion circuitry to receive the hold sample from the first sampling capacitor in the hold state, and to convert successive hold samples into a digital signal corresponding to the input signal.

10. The circuit of claim 9, wherein the body terminal of the charge cancellation transistor is connected to a gate terminal of the charge cancellation transistor.

11. The circuit of claim 9, wherein the held signal terminal of the charge cancellation transistor is coupled to the first sampling capacitor.

12. The circuit of claim 9, further comprising
a second sampling capacitor; and
a second switching field effect transistor (second switching transistor) that is controllable to:
   connect the input signal to the second sampling capacitor when the first switching transistor is in the track state; and
   isolate the input signal from the second sampling capacitor when the first switching transistor is in the hold state;
wherein the second sampling capacitor is switchably connected to the held signal terminal of the charge cancellation transistor during the hold state.

13. The circuit of claim 12, further comprising a buffer amplifier comprising:
an input terminal connected to the second sampling capacitor; and
an output terminal connected to the held signal terminal of the charge cancellation transistor.

14. The circuit of claim 11, further comprising a buffer amplifier comprising:
an input terminal connected to the first sampling capacitor; and
an output terminal connected to the held signal terminal of the charge cancellation transistor.

15. The charge cancellation circuit of claim 9, wherein a source terminal of the charge cancellation transistor is connected to a drain terminal of the charge cancellation transistor.

16. A method for track and hold sampling, comprising:
controlling a first field effect switching transistor (first switching transistor) to:
   connect a signal source to a first sampling capacitor in a track state; and
   isolate the signal source from the first sampling capacitor in a hold state, the first sampling capacitor providing a sample signal in the hold state;
controlling a cancellation field effect transistor (cancellation transistor) to inject a charge onto the first sampling capacitor that cancels a charge injected onto the first sampling capacitor by the first switching transistor when the first switching transistor switches from the track state to the hold state;
connecting a body terminal of the first switching transistor to a source terminal of the first switching transistor when the first switching transistor is in the track state, and connecting the body terminal of the first switching transistor to a common voltage when the first switching transistor is in the hold state; and
connecting a body terminal of the cancellation transistor to a held signal voltage corresponding to the sample signal when the first switching transistor is in the hold state, and connecting the body terminal of the cancellation transistor to a common voltage when the first switching transistor is in the track state.

17. The method of claim 16, wherein the body terminal of the cancellation transistor is connected to a gate terminal of the cancellation transistor.

18. The method of claim 16, wherein the held signal voltage is provided by:
controlling a second switching field effect transistor (second switching transistor) to:
   connect the signal source to a second sampling capacitor during the track state; and
   isolate the signal source from the second sampling capacitor during the hold state;
connecting, in the hold state, the second sampling capacitor to the body terminal of the cancellation transistor.

19. The circuit of claim 16, wherein the held signal voltage is provided by connecting, in the hold state, the body terminal of the cancellation transistor to the first sampling capacitor.

* * * * *